(12) United States Patent
Khusnatdinov et al.

(10) Patent No.: US 10,304,690 B2
(45) Date of Patent: May 28, 2019

(54) FLUID DISPENSE METHODOLOGY AND APPARATUS FOR IMPRINT LITHOGRAPHY

(71) Applicant: CANON KABUSHIKI KAISHA, Tokyo (JP)

(72) Inventors: Niyaz Khusnatdinov, Round Rock, TX (US); Dwayne L. LaBrake, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/466,662

(22) Filed: Mar. 22, 2017

(65) Prior Publication Data

US 2018/0277383 A1    Sep. 27, 2018

(51) Int. Cl.
| | |
|---|---|
| *G03F 7/00* | (2006.01) |
| *H01L 21/02* | (2006.01) |
| *B29C 59/02* | (2006.01) |
| *H01L 21/3105* | (2006.01) |
| *B29L 31/34* | (2006.01) |

(52) U.S. Cl.
CPC ........ *H01L 21/31058* (2013.01); *B29C 59/02* (2013.01); *G03F 7/0002* (2013.01); *H01L 21/02118* (2013.01); *H01L 21/02282* (2013.01); *H01L 21/02318* (2013.01); *B29L 2031/34* (2013.01)

(58) Field of Classification Search
CPC ...... B41M 7/0081; B82Y 10/00; B82Y 40/00; G03F 7/0002
USPC .......................................................... 347/10
See application file for complete search history.

(56) References Cited

U.S. PATENT DOCUMENTS

| | | | |
|---|---|---|---|
| 6,228,311 B1* | 5/2001 | Temple | B23K 26/0604 |
| | | | 264/400 |
| 8,001,924 B2 | 8/2011 | Dijksman et al. | |
| 8,827,400 B2 | 9/2014 | Kodama | |
| 2001/0019340 A1* | 9/2001 | Kubo | B41J 2/01 |
| | | | 347/1 |
| 2009/0244173 A1* | 10/2009 | Yokouchi | B41J 2/14233 |
| | | | 347/33 |
| 2013/0010020 A1* | 1/2013 | Kodama | B82Y 10/00 |
| | | | 347/10 |
| 2016/0236468 A1* | 8/2016 | Chng | B41J 2/162 |
| 2017/0291410 A1* | 10/2017 | Kaneko | B41J 2/2135 |

FOREIGN PATENT DOCUMENTS

WO    2013129679 A1    9/2013

* cited by examiner

*Primary Examiner* — Edward Chin
(74) *Attorney, Agent, or Firm* — Abel Schillinger, LLP

(57) ABSTRACT

A method of can be used to generating a fluid droplet pattern for an imprint lithography process. A fluid dispense head can include a set of fluid dispense ports, wherein the fluid dispense ports are in a fixed arrangement. The method can include rotating the set of the fluid dispense ports to a rotation angle to change a fluid droplet pitch in a first direction; moving a substrate and the set of the fluid dispense ports relative to each other in a second direction substantially perpendicular to the first direction; and dispensing fluid droplets onto the substrate while moving the substrate and the set of the fluid dispense ports relative to each other. The method can be used in the formation of an electronic component within or over a semiconductor substrate. The apparatus can be configured to carry out the methods as described herein.

18 Claims, 6 Drawing Sheets

$|A'_1 B'_1| = |B'_1 C'_1| = |C'_1 A'_2|$

FLUID DISPENSE METHODOLOGY AND APPARATUS FOR IMPRINT LITHOGRAPHY

FIELD OF THE DISCLOSURE

The present disclosure relates to imprint lithography, and more particularly to fluid droplet patterns for imprint lithography applications.

RELATED ART

Imprint lithography apparatuses and processes are useful in forming nanoscale patterns on semiconductor wafers in the fabrication of electronic devices. Such apparatuses and processes can include the use of fluid dispense systems for depositing a formable material, for example, a polymerizable material, such as a resin or a resist, onto the wafer, using techniques such as fluid droplet dispense. The dispensed material is contacted with an imprint template (or mold) having desired pattern features and then solidified, forming a patterned layer on the wafer. Template feature fill rates and related defects are dependent, in part, on template pattern feature density and orientation and the droplet pattern arrangement, including the fluid droplet pitch.

Traditional fluid dispense systems permit some adjustment of the fluid droplet pitch, however, they typically have constraints that limit the extent of such adjustments. Thus, there continues to be an industry demand for droplet pattern processes which are more finely adjustable and which are not limited by dispenser limitations.

SUMMARY

In an aspect, a method can be used to generate a fluid droplet pattern for an imprint lithography process. The method of generating a fluid droplet pattern for an imprint lithography process, the method can include providing a fluid dispense head including a set of fluid dispense ports, wherein the fluid dispense ports are in a fixed arrangement relative to one another, wherein the set of the fluid dispense ports are arranged in at least two rows and at least two columns; rotating the set of the fluid dispense ports to a rotation angle to change a fluid droplet pitch in a first direction while the fluid dispense ports remain in the fixed arrangement; moving a substrate and the set of the fluid dispense ports relative to each other in a second direction substantially perpendicular to the first direction; and dispensing fluid droplets of a formable material onto the substrate while moving the substrate and the set of the fluid dispense ports relative to each other, wherein the fluid droplets of the fluid droplet pattern have the fluid droplet pitch in the first direction.

In an embodiment, rotating set of the fluid dispense ports includes rotating a fixture that holds the set of the fluid dispense ports in the fixed arrangement.

In another embodiment, the method further includes determining the rotation angle to achieve the fluid droplet pitch in the first direction.

In a particular embodiment, determining the rotation angle includes selecting a particular rotation angle from a set of discrete rotation angles.

In another particular embodiment, the set of discrete rotation angles includes at least three different rotation angles.

In a further embodiment, during dispensing, the set of the fluid dispense ports are oriented along a plane that is substantially planar to a major surface of the substrate.

In still another embodiment, rotating is along a plane substantially parallel to a major surface of the substrate.

In yet another embodiment, the method further includes determining a firing order and timing for firing of the fluid dispense ports within the set of fluid dispense ports.

In another aspect, a method can be used to manufacture an article. The method can include providing a fluid dispense head including a set of fluid dispense ports, wherein the fluid dispense ports are in a fixed arrangement relative to one another, wherein the set of the fluid dispense ports are arranged in at least two rows and at least two columns; rotating the set of the fluid dispense ports to a rotation angle to change a fluid droplet pitch in a first direction while the fluid dispense ports remain in the fixed arrangement; moving a substrate and the set of the fluid dispense ports relative to each other in a second direction substantially perpendicular to the first direction; dispensing fluid droplets of a formable material onto the substrate while moving the substrate and the set of the fluid dispense ports relative to each other, wherein the fluid droplets of the fluid droplet pattern have the fluid droplet pitch in the first direction; contacting the formable material with a template having a surface; and curing the formable material to form a layer corresponding to the surface of the template.

In an embodiment, the article includes an electronic device, and the substrate includes a semiconductor wafer.

In a further aspect, an apparatus can be used in imprint lithography. The apparatus can include a fluid dispense head including a set of fluid dispense ports, wherein the fluid dispense ports are in a fixed arrangement relative to one another, wherein the set of the fluid dispense ports are arranged in at least two rows and at least two columns; a stage, wherein the stage, the set of the fluid dispense ports, or the substrate and the set of the fluid dispensed ports are adapted to move a substrate and the fluid dispense ports relative to each other; and a logic element. The logic element can be configured to transmit information to rotate the set of the fluid dispense ports to a rotation angle to change a fluid droplet pitch in a first direction while the set of the fluid dispense ports remain in the fixed arrangement; transmit information to move a substrate and the set of the fluid dispense ports relative to each other in a second direction substantially perpendicular to the first direction; and transmit information to dispense fluid droplets of a formable material onto the substrate while moving the substrate and the set of the fluid dispense ports relative to each other, wherein the fluid droplets of the fluid droplet pattern have the fluid droplet pitch in the first direction.

In an embodiment, transmit information to rotate the set of the fluid dispense ports includes transmit information to rotate a fixture that holds the set of the fluid dispense ports in the fixed arrangement.

In a particular embodiment, the fixture is coupled to a shaft.

In another embodiment, the logic element is further configured to determine the rotation angle to achieve the fluid droplet pitch in the first direction.

In a particular embodiment, determine the rotation angle includes select a particular rotation angle from a set of discrete rotation angles.

In another particular embodiment, the set of discrete rotation angles includes at least three different rotation angles.

In a further embodiment, the set of the fluid dispense ports are oriented along a plane that is substantially planar to a major surface of the substrate.

In still another embodiment, transmit information to rotate the set of the fluid dispense ports includes transmit information to rotate the set of the fluid dispense ports in a plane substantially parallel to a major surface of the substrate.

In another embodiment, (a) at least one allowable positive angle rotation does not have an allowable corresponding negative angle rotation of a same magnitude as the allowable positive angle; (b) at least one allowable negative angle rotation does not have an allowable corresponding positive angle rotation of a same magnitude as the allowable negative angle; or both (a) and (b).

In still another embodiment, the rows and the columns lie along lines, such that the lines corresponding to the rows intersect the lines corresponding to the columns at angles other than right angles.

BRIEF DESCRIPTION OF THE DRAWINGS

Embodiments are illustrated by way of example and are not limited in the accompanying figures.

Figure 1:
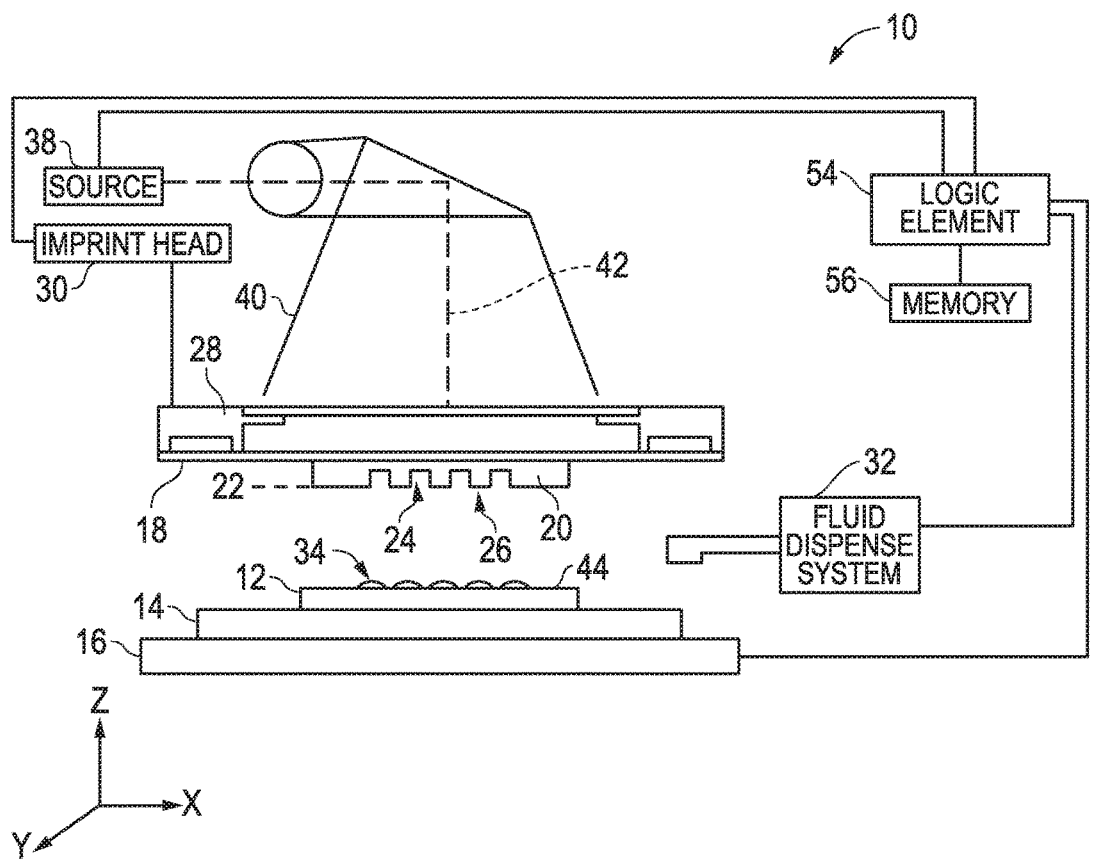
FIG. 1 includes an illustration of a side view of an exemplary imprint lithography system.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

The term "pitch" is intended to mean a distance from a center of a feature to a center of a next adjacent feature. For a fluid droplet pattern, the fluid droplet pitch is a distance from the center of a fluid droplet to the center of the next adjacent fluid droplet. In Cartesian coordinates, a two-dimensional pattern (a pattern as seen from a top view) can have a pitch in the X-direction that corresponds to the distance between the centers of the features as measured in the X-direction (X-direction pitch), and a pitch in the Y-direction that corresponds to the distance between the centers of the features as measured in the Y-direction (Y-direction pitch). The X-direction pitch may be the same or different from the Y-direction pitch.

As used herein, velocity and motion may be described on a relative basis. For example, object A and object B move relative to each other. Such terminology is intended to cover object A is moving, and object B is not; object A is not moving, and object B is moving; and both of objects A and B are moving.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

A method of can be used to generating a fluid droplet pattern for an imprint lithography process. The method can be performed using an imprint lithography apparatus including a fluid dispense head that includes a set of fluid dispense ports, wherein the fluid dispense ports in a fixed arrangement relative to one another, and the set of the fluid dispense ports are arranged in at least two rows and at least two columns. The method can include rotating the fluid dispense ports to a rotation angle to change a fluid droplet pitch in a first direction while the fluid dispense ports remain in the fixed arrangement; moving a substrate and the fluid dispense ports relative to each other in a second direction substantially perpendicular to the first direction; and dispensing fluid droplets of a formable material onto the substrate while moving the substrate and the fluid dispense ports relative to each other, wherein the fluid droplets of the fluid droplet pattern have the fluid droplet pitch in the first direction. In a particular embodiment, the method can be used in forming an electronic device on or within a semiconductor wafer. The apparatus can include a logic element that can assist in performing the method or provide instructions or other information is carrying out the method.

Embodiments described herein allow for relatively smaller Y-direction fluid droplet pitches to be achieved without reconfiguring the arrangement of a set of fluid dispense ports. Thus, an existing apparatus can be used for smaller geometries than what may have been originally intended. Such smaller geometries can be achieved by as little as rotating the set of the fluid dispense ports. Simulations can be performed to determine a set of allowable discrete angles of rotation that can achieve a substantially uniform fluid droplet pitch. Any of several implementations may be used, and thus, the particular implementation can be tailored to a particular equipment configuration of an imprint lithography apparatus. A costly redesign of a fixture that holds the fluid dispense ports or fluid channels within the fixture can be avoided. In particular, the fluid dispense system does not need to have the fluid dispense ports or fluid channels within the fluid dispense head reconfigured or have the orientation of the set of the fluid dispense ports along a plane that is not substantially parallel to the major surface of the substrate. Furthermore, the number of rows and columns as described herein may allow for an imprint field to be formed in as little as a single pass or in fewer passes than when the set of fluid dispense ports are oriented along a single row or a single column.

Details regarding the apparatus and method are better understood after reading this specification in conjunction with figures. The description below is meant to illustrate embodiments and not limit the scope of the present invention, which is defined in the appended claims.

Referring to FIG. 1, a lithographic system 10 in accordance with an embodiment described herein can be used to form a relief pattern on a substrate 12. The substrate 12 may be coupled to a substrate chuck 14. As illustrated, the substrate chuck 14 is a vacuum chuck; however, in other embodiments the substrate chuck 14 may be any chuck including vacuum, pin-type, groove-type, electrostatic, electromagnetic, or the like. The substrate 12 and substrate chuck 14 may be further supported by a stage 16. The stage 16 may provide translating or rotational motion along the X-, Y-, or Z-directions. The stage 16, substrate 12, and substrate chuck 14 may also be positioned on a base (not illustrated).

Spaced-apart from the substrate 12 is a template 18. The template 18 can include a body having a first side and a second side with one side having a mold 20 extending therefrom towards the substrate 12. The mold 20 is sometimes referred to as a mesa. In an embodiment, the template 18 can be formed without a mold 20.

The template 18, mold 20, or both may be formed from such materials including fused-silica, quartz, silicon, organic polymers, siloxane polymers, borosilicate glass, fluorocarbon polymers, metal, hardened sapphire, other similar materials, or any combination thereof. The template 18 and mold 20 can include a single piece construction. Alternatively, the template 18 and mold 20 can include separate components coupled together. As illustrated, an imprint surface 22 of the mold 20 includes features defined by spaced-apart recesses 24 and protrusions 26. The imprint surface 22 may define any original pattern that forms the basis of a pattern to be formed on the substrate 12. In another embodiment, the imprint surface 22 can be a blank, that is, the imprint surface 22 does not have any recesses or projections.

The template 18 can be coupled to a chuck 28. The chuck 28 can be configured as vacuum, pin-type, groove-type, electrostatic, electromagnetic, or another similar chuck type. In an embodiment, the chuck 28 may be coupled to an imprint head 30 such that the chuck 28 or imprint head 30 can facilitate movement of the template 18.

The lithographic system 10 can further include a fluid dispense system 32 used to deposit a formable material 34 on the substrate 12. For example, the formable material 34 can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the mold 20 and the substrate 12, depending on design considerations. For example, the formable material 34 can include a monomer mixture that can be cured using ultraviolet light, heat, or the like.

The lithographic system 10 can further include an energy source 38 coupled to a direct energy 40 along a path 42. The imprint head 30 and stage 16 can be configured to position the template 18 and substrate 12 in superimposition with the path 42. The lithographic system 10 can be regulated by a logic element 54 in communication with the stage 16, imprint head 30, fluid dispense system 32, or source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

Figure 2:
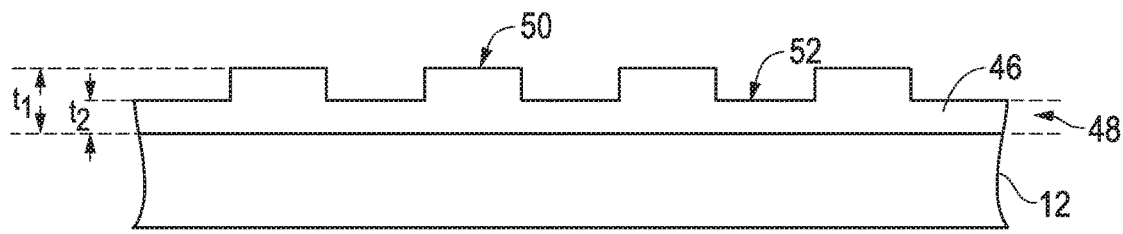
FIG. 2 includes an illustration of a cross-sectional view of the substrate illustrated in FIG. 1 after forming a patterned layer.

Referring to FIGS. 1 and 2, an embodiment, either the imprint head 30, the stage 16, or both the imprint head 30 and the stage 16 vary a distance between the mold 20 and the substrate 12 to define a desired volume therebetween that is filled by the formable material 34. For example, the imprint head 30 can apply a force to the template 18, such that the mold 20 contacts the formable material 34 on the substrate 12. After the desired volume is filled with the formable material 34, the source 38 can produce energy 40, e.g., ultraviolet radiation, causing the formable material 34 to solidify or cross-link to define the patterned layer 46 on the substrate 12. The patterned layer 24 has a lower surface conforming to a shape of the surface 44 of the substrate 12 and an upper surface conforming to a shape of the imprint surface 22. As illustrated in FIG. 2, the patterned layer 46 can include features, illustrated as protrusions 50 and recessions 52, with the protrusions 50 having a thickness, $t_1$ and the recessions 52 correspond to a residual layer 48 having a thickness $t_2$, which is the residual layer thickness (RLT).

When using a droplet dispense method for the formable material 34, the imprint operation generally includes (1) moving the substrate 12 and fluid dispense ports of the fluid dispense system 32 relative to each other, (2) dispensing (or depositing) fluid droplets of the formable material 34 on a surface of the substrate 12, (3) bringing the imprint surface 22 of the template 18 into contact with the fluid droplets such that the fluid spreads and fills the topography of the imprint surface 22, (4) solidifying (e.g., photocuring or thermally curing) the formable material 34, and (5) separating the template 18 from the substrate 12, leaving the patterned layer 46 of formable material 34 on the substrate surface, wherein the patterned layer 46 has a relief image of the imprint pattern 22.

Dispensing fluid droplets of formable material on the substrate surface and proper filling of the pattern of the template 18 are major contributors to the imprint cycle time, and thus throughput. Particular template patterns may require multiple passes of the substrate 12 relative to the imprint head 30. That is, the substrate 12 and imprint head 30 must be translated relative to each other multiple times. Multiple dispensing passes are common, for example, when templates have dense feature patterns or for particular patterns requiring adjacent droplets be positioned closer together. Methods and systems to reduce dispense time and potentially dispense passes are described in accordance with one or more embodiments described herein.

During dispensing, fluid droplets of formable material 34 are dispensed from the fluid dispense system 32 to create a pattern of fluid droplets on the substrate surface 44. Having the proper X-direction fluid droplet pitch and Y-direction fluid droplet pitch can be important considerations to achieve a proper fluid droplet pattern with fewer dispense passes. As used in this specification, the X-direction is along the exposed major surface of the substrate 12 and corresponds to the direction that the substrate 12 and the set of the fluid dispense ports move relative to one another during a dispensing operation, and the Y-direction is also along the exposed major surface of the substrate 12 and is perpendicular to the X-direction.

The X-direction can be adjusted by controlling the relative velocity between the substrate and the set of the fluid dispense ports during dispensing when the dispense rate from the fluid dispense ports is known. As the relative velocity increases, the X-direction fluid droplet pitch likewise increases, and as the relative velocity decreases, the X-direction fluid droplet pitch likewise decreases, both assuming that the fluid droplet dispense rate remains constant.

The Y-direction fluid droplet pitch is dependent on the spacing and organization of the fluid dispense ports, and thus, controlling the Y-direction fluid droplet pitch can be more challenging as compared to controlling the X-direction fluid droplet pitch. The inventors have discovered a novel way to control the Y-direction fluid droplet pitch, even when the fluid dispense ports remain in a fixed position relative to one another. In an embodiment, the fluid dispense ports can be rotated while they remain in the fixed position relative to one another to achieve a variety of different Y-direction fluid droplet pitches.

Figure 3:
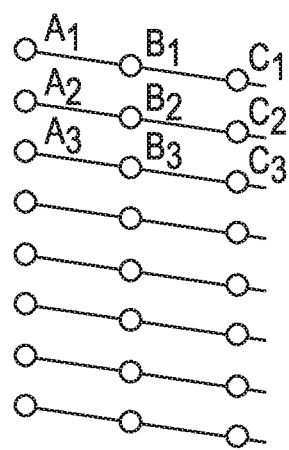
FIG. 3 includes an illustration of an arrangement of fluid dispense ports in accordance with an embodiment.

FIG. 3 includes an illustration of a fluid dispense ports in accordance with an embodiment. In many embodiments, the set of the fluid dispense ports can be organized in at least two rows and at least two columns. In the illustration, the organization of the set of the fluid dispense ports has eight rows and three columns of fluid dispense ports. Fluid dispense ports $A_1$, $B_1$, and $C_1$ are along one row, fluid dispense ports $A_2$, $B_2$, and $C_2$ are along another row, and fluid dispense ports $A_3$, $B_3$, and $C_3$ are along a further row, In practice, more or fewer rows or columns may be used. In the embodiment as illustrated, the fluid dispense ports along the same column can have a minimum pitch that may be determined by equipment used to construct a fluid dispense head. For example, the minimum pitch between fluid dispense ports along the same column may be at least 400 microns, at least 500 microns, at least 600 microns, or more.

Figure 4:
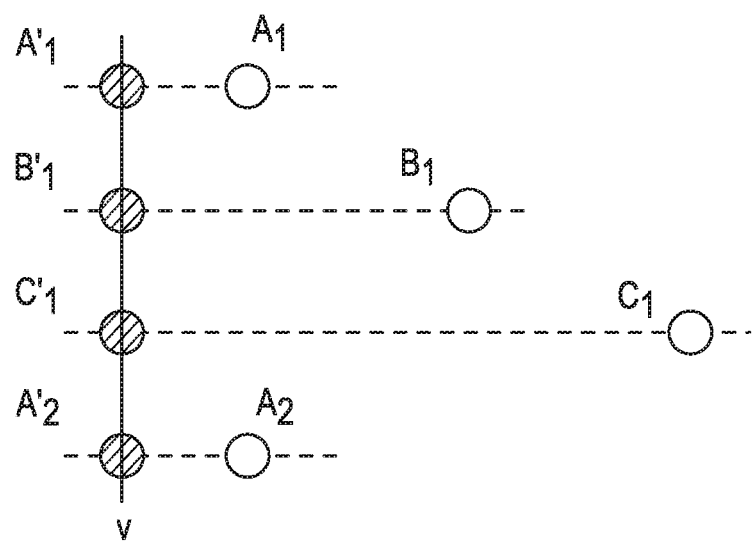
FIG. 4 includes an illustration of an enlarged view of a portion of the arrangement of fluid dispense ports and a Y-direction fluid droplet pitch that can be obtained using the arrangement.

The rows are oriented to create a staggered arrangement, rather than the rows being oriented perpendicular to the columns. The staggered arrangement allows for a smaller Y-direction fluid droplet pitch. FIG. 4 includes an enlarged portion of the fluid dispense ports as illustrated in FIG. 3, and how such ports are projected along line V to illustrate better a Y-direction fluid droplet pitch that can be obtained. In a particular embodiment, the line V may be at an integer of the X-direction fluid droplet pitch. In particular, fluid dispense ports $A_1$, $B_1$, $C_1$, and $A_2$ correspond to fluid droplets $A_1'$, $B_1'$, $C_1'$, and $A_2'$, respectively, along line V. To achieve the Y-direction fluid droplet pitch, the substrate and the set of fluid dispense points can be in motion relative to each other, and fluid dispense ports can be fired as they cross the line V. Thus, when the set of fluid dispense ports are moving to the right relative to the substrate, the firing order can be C1, then B1, and then A1 and A2, where both A1 and A2 are fired simultaneously. The staggered arrangement can allow the fluid droplet pitch to be less than the minimum pitch of the fluid dispense ports along the same column of ports. In the illustration, the Y-direction fluid droplet pitch can be reduced to ⅓ of separation along the same column. For example, the Y-direction fluid droplet pitch for the fluid dispense ports A1 and A2 may be 450 microns. When the dispense ports A1, A2, B1, and C1 are projected onto the line V, the staggered arrangement can allow the Y-direction fluid droplet pitch to be 150 microns. However, an even smaller Y-direction fluid droplet pitch may be desired.

Figure 5:
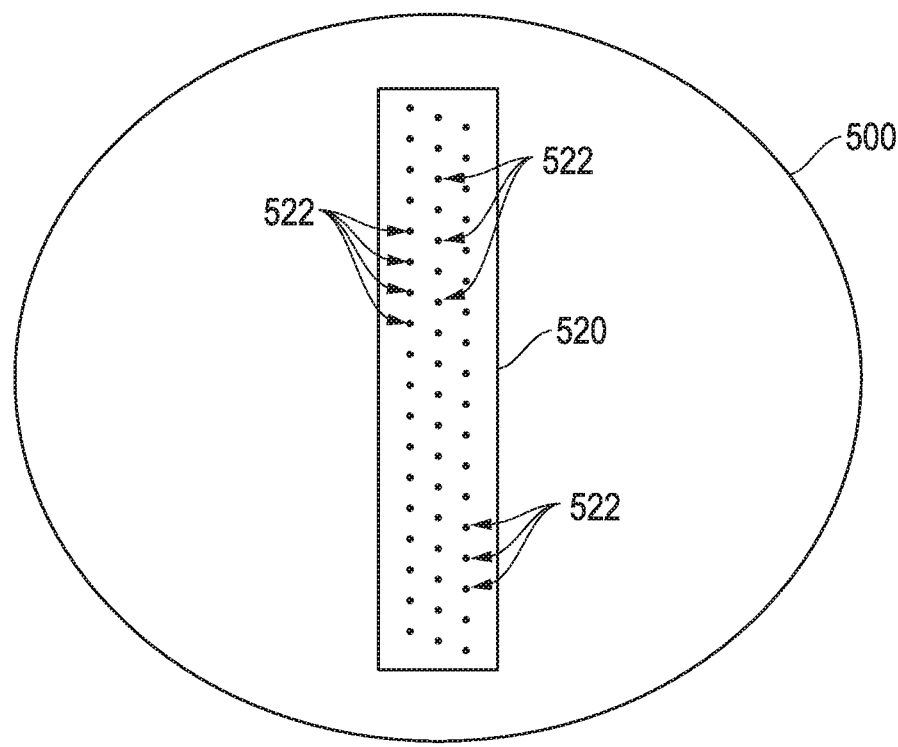
FIG. 5 includes an illustration of a bottom view of a fluid dispense head.
Figure 6:
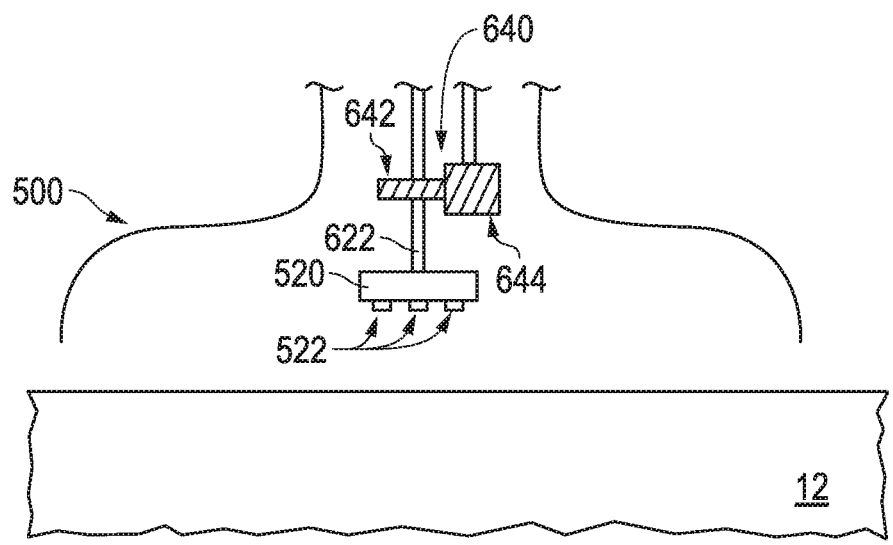
FIG. 6 includes an illustration of a side view of the fluid dispense, where part of a cover for the fluid dispense head is removed.

Referring to FIGS. 5 and 6, the apparatus can be configured to have a fluid dispense head 500 that includes a fixture 520, and a gear arrangement 640. FIG. 5 includes a bottom view of the fluid dispense head 500, and FIG. 6 includes a cross-sectional view of the fluid dispense head 500. In an embodiment, the set of the fluid dispense ports 522 can be located within the fixture 520 of the fluid dispense head 500 that keeps the fluid dispense ports 522 in a fixed arrangement relative to one another. In a particular embodiment, the fixture 520 can be rotated using the gear assembly 600. As illustrated in FIG. 6, a shaft 622 is coupled to the fixture 520. The shaft 622 can be releasably attached to the fixture 520, such as with male/female threads along the end of the shaft and within the fixture or with set screws, or may be permanently attached with an adhesive or by welding the shaft 622 and fixture 520 to each other. Other ways of securing the shaft 622 and fixture 520 to one another can be performed if needed or desired.

The gear arrangement 640 can include a gear 642 attached the shaft 622 and another gear 644 controlled by a stepper motor (not illustrated) or another mechanism that can allow rotation to be performed to a precise angle. Thus, the combination of the fixture 520 and the gear arrangement 640 allow the fluid dispense ports 522 can be rotated while still maintaining the fluid dispense ports 522 fixed arrangement relative to one another. The rotation can be along a plane that is substantially parallel to the plane corresponding to the exposed major surface of the substrate 12. As used herein, substantially parallel is intended to mean that planes, lines, or a combination of a plane and a line are parallel or within 5.7° of being parallel to each other. In the embodiment as illustrated in FIGS. 5 and 6, the fixture 520 can be rotated about a centerpoint of the fixture 520. In another embodiment, the fixture 520 can be rotated about one of its corners or another position within or outside the fixture 520.

The rotation can performed and still maintain a substantially uniform Y-direction fluid droplet pitch for an imprint field. Substantially uniform fluid droplet pitch is intended to mean that the center-to-center distance between an immediately adjacent pair of fluid droplets in the Y-direction, such as illustrated along the V line in FIG. 4, is within 10% of the average center-to-center distances between immediately adjacent pairs of fluid droplets in the Y-direction. In order to achieve the substantially uniform Y-direction fluid droplet pitch, discrete angles of rotation may be used. In the embodiment as illustrated, the number of allowable discrete angles depend on the number of columns of fluid dispense ports. In FIG. 3, the arrangement of fluid dispense ports includes eight rows and three columns. In practice, the number of rows can be substantially greater than eight and may exceed 100. The allowable discrete angles of rotation to achieve a substantially uniform Y-direction fluid droplet pitch depends on the number of columns. For the 3-column arrangement illustrated where the Y-pitch ($d_0$) is 141 microns and the angle between rows and column is 80.54°, Tables 1 and 2 list 21 allowable rotational angles and their corresponding relative Y-direction fluid droplet pitches that can be achieved.

TABLE 1

Positive Rotation Angles and Y-direction Fluid Droplet Pitch

| Rotation (degrees) | 0 | 18.4 | 26.6 | 39.8 | 45.0 | 53.1 | 56.3 | 61.4 | 63.4 | 66.8 | 68.2 |
|---|---|---|---|---|---|---|---|---|---|---|---|
| Pitch ($d/d_0$) | 1.00 | 0.95 | 0.89 | 0.77 | 0.71 | 0.60 | 0.55 | 0.48 | 0.45 | 039 | 0.37 |

TABLE 2

Negative Rotation Angles and Y-direction Fluid Droplet Pitch

| Rotation (degrees) | 0 | −9.5 | −26.6 | −33.7 | −45.0 | −49.3 | −56.3 | −59.0 | −63.4 | −65.2 | −68.2 |
|---|---|---|---|---|---|---|---|---|---|---|---|
| Relative Pitch ($d/d_0$) | 1.00 | 0.99 | 0.89 | 0.83 | 0.71 | 0.65 | 0.55 | 0.51 | 0.45 | 042 | 0.37 |

In Table 1, rotations are in degrees, where 0° corresponds to the columns of fluid dispense ports 522 oriented parallel to the Y-direction. The angles listed in Tables 1 and 2 are rounded to the nearest tenth of a degree to aid in understanding the concepts herein. In practice, a higher level of precision for the rotation angle may be used to achieve a desired Y-direction fluid droplet pitch. Fluid droplet pitches are expressed as a fraction of the fluid droplet pitch when the rotation angle is 0° ($d_0$). Rotations may be performed in a clockwise (negative) direction, a counterclockwise (positive) direction, or combinations of such directions. The choice of direction may depend on the desired Y-direction fluid droplet pitch, the configuration of the fluid dispense head 500, feed lines for the fluid dispense ports 522, or other apparatus considerations. Note that some of the absolute values of angles and pitches in Table 1 have similar values in Table 2. For example, rotations of 26.6 and −26.6 can achieve a relative Y-direction fluid droplet pitch of 0.89. However, absolute values of other angles, pitches, or both in Table 1 are not found in Table 2, and vice versa. For example, a rotation of 18.4° (in Table 1) is allowed, but a rotation of −18.4° (not in Table 2) is not allowed, and a rotation of −9.5° (in Table 2) is allowed, but a rotation of 9.5° (not in Table 1) is not allowed. Thus, the allowable positive and negative rotations can be asymmetric.

The minimum pitch for the fluid droplet pitch can be at most 80% of the maximum pitch of the fluid droplet pitch for the previously described arrangement of fluid dispense ports. Referring to Table 1, the maximum pitch in the Y-direction occurs at a rotational angle of 0° ($d/d_0$=1.00). The minimum pitch the maximum pitch in the Y-direction may be at a rotational angle of 68.2° ($d/d_0$=0.37), which corresponds to 37% of the maximum pitch for the particular arrangements of fluid dispense ports. Other fluid dispense port arrangements can have other minimum pitches.

Substantially uniform Y-direction fluid droplet pitches may be achieved at only discrete angles of rotation. Thus, many other angles of rotation not listed within Table 1 may not produce a substantially uniform Y-direction fluid droplet pitch. For example, a rotation of 39.8° can achieve a substantially uniform Y-direction fluid droplet pitch that is 0.77 times the Y-direction fluid droplet pitch when the rotation angle is 0°, and a rotation of 45.0° can achieve a substantially uniform Y-direction fluid droplet pitch that is 0.71 times the Y-direction fluid droplet pitch when the rotation angle is 0°. However, a substantially uniform Y direction fluid droplet pitch may not be achieved when the rotation angle is 42.1°, or another rotational angle between and significantly different from 39.8° and 45.0°.

As the number of columns decreases, the number of allowable rotational angles while still achieving a substantially uniform Y-direction fluid droplet pitch increases. However, as the rotational angle becomes too great, more than one dispense pass may be needed to dispense fluid droplets for a single imprint field. As the number of columns increase, the number of allowable rotational angles while still achieving a substantially uniform Y-direction fluid droplet pitch decreases. Furthermore, as the number of columns increases, the complexity of the fixture 520 and fluid dispense head 500 increases. Other factors that can affect the allowable rotations can include the spacing between columns of fluid dispense ports 522 and the angle at which the rows and columns intersect. After reading this specification, skilled artisans will be able to determine the number and layout of fluid dispense ports 522 to meet the needs or desires for a particular application.

Figure 7:
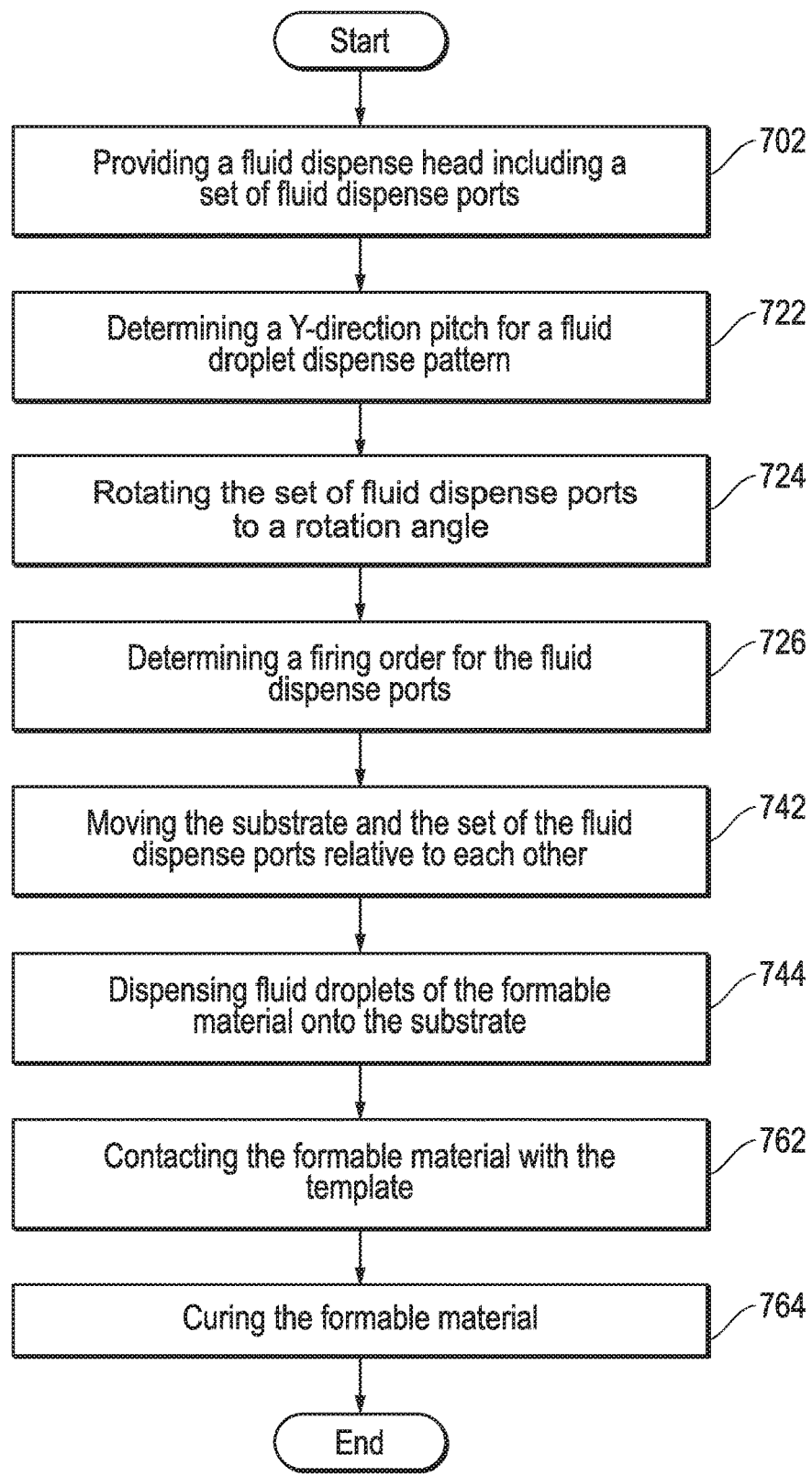
FIG. 7 includes a flow chart of an exemplary method of forming an article, including generating a fluid droplet pattern using the apparatus of FIG. 1.

In accordance with an embodiment described herein, FIG. 7 includes a flow chart for a method that can be used forming a substrate fluid droplet pattern for an imprint lithography process. The method is better understood with respect to the apparatus 10 in FIG. 1 and the fluid dispense head in FIGS. 5 and 6.

The method can include providing a fluid dispense head including a set of fluid dispense ports, at block 702 in FIG. 7. The method can be performed by the imprint lithography apparatus 10 as previously described and can include the fluid dispense system 32, the stage 16, and the logic element 54. In an embodiment, the fluid dispense system 32 includes the fluid dispense head 520 having the set of the fluid dispense ports 522. Along each column, the fluid dispense ports 522 have a pitch of approximately 450 microns. The three columns can be a particular spacing between each other, and the rows and columns intersect at a particular angle. At a rotational angle of 0°, the Y-direction fluid droplet fluid droplet pitch is approximately 150 microns.

The method can further include determining a Y-direction fluid droplet pitch for a fluid droplet dispense pattern, at block 722 in FIG. 7. The Y-direction fluid droplet pitch may depend on the particular pattern of the template, the viscosity or other properties of the formable material, or the like. The determination of the Y-direction fluid droplet pitch may be made by the logic element 54. In a particular embodiment, a look-up table may be in an FPGA to allow the determination to be performed quickly within the apparatus 10. In another embodiment, the determination of the rotational angle may be made by the processor or another type of logic device. In a particular example, the Y-direction fluid droplet pitch for the fluid droplets may be 90 microns. Referring to Table 1, the logic element 54 can determine that the fluid dispense ports need to be rotated 53.1°.

Figure 8:
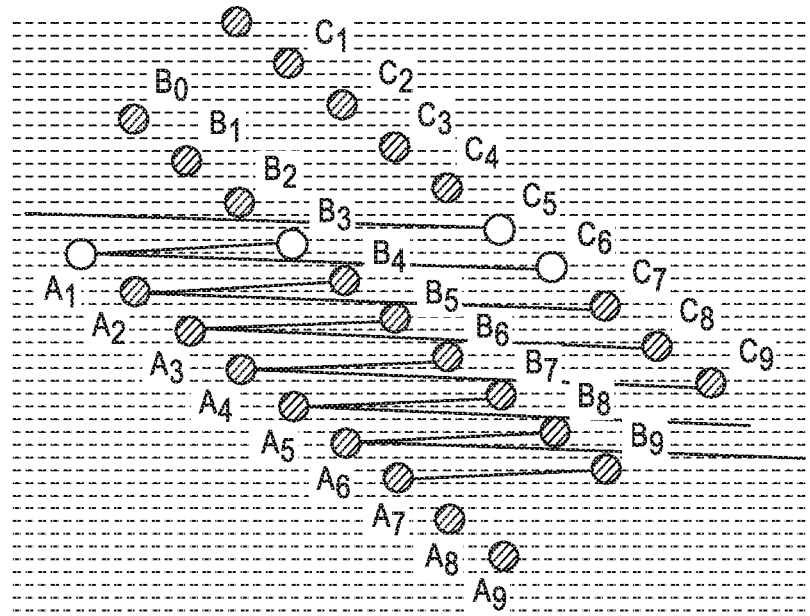
FIG. 8 includes an illustration of the arrangement of fluid dispense ports after rotating the fluid dispense ports while fluid dispense ports remain in a fixed position relative to one another.

The method further includes rotating the set of the fluid dispense ports to a rotation angle, at block 724 in FIG. 7. The logic element 54 can transmit information to the fluid dispense system 32 to have the fluid dispense ports 522 rotated by 53.1°. FIG. 8 illustrates the set of the fluid dispense ports 522 after being rotated 53.1°. The rotation is performed while the fluid dispense ports 522 remain in the fixed position relative to one another. In a particular embodiment, the fixture 520 is rotated.

The method can include determining a firing order for the fluid dispense ports, at block 726. The rotation can affect the timing when the dispense ports are fired. The decision whether to fire or not fire a fluid dispense port will correspond to when the fluid dispense ports cross lines corresponding to integer values of the X-direction fluid droplet pitch. At a heaviest fluid droplet areal density, all of the fluid dispense ports will fire as they cross a particular line associated with the X-direction fluid droplet pitch. Referring briefly to FIG. 8, the set of fluid dispense ports are rotated 53.1°. Focusing the subset of fluid dispense ports A1, B3, C5, and C6, and the relative firing order between such fluid dispense ports can be C5, C6, B3, then A1. The firing of C5 and C6 may be very close in time to firing of B5, B6, B7, and A9. Modeling software can be used to determine the positions of the fluid dispense ports as they cross integer multiples of the X-direction fluid droplet pitch.

The firing order and other timing can be obtained from such information. In a particular embodiment, the fluid dispense ports may only be allowed to fire at integer multiples of the X-direction pitch. For a lighter fluid droplet areal density, not all fluid dispense ports are fired at a particular integer multiple of the X-direction pitch. For example, in a diamond dispense pattern, even numbered fluid ports may be fired when they cross an even integer multiple of the X-direction pitch, and odd numbered fluid ports may be fired when they cross an odd integer multiple of the X-direction pitch. In this embodiment with the diamond dispense pattern, the even numbered fluid ports are not fired when they cross an odd integer multiple of the X-direction pitch, and the odd numbered fluid ports are not fired when they cross an even integer multiple of the X-direction pitch. Neither the even numbered fluid ports nor the odd numbered fluid dispense parts are fired at non-integer multiples of the X-direction pitch. Thus, the firing order and timing for firing the dispense ports can depend on the arrangement of the set of fluid dispense ports, the rotational angle of the set of fluid dispense ports, and the local areal density of the fluid droplet pattern.

The method can still further include moving the substrate and the set of the fluid dispense ports relative to each other, at block 744 in FIG. 7. The relative velocity between the substrate 12 and the set of the fluid dispense ports 522 may be affected by the desired X-direction fluid droplet pitch. The relative velocity may depend on the fluid droplet dispense frequency from the fluid dispense ports 522. The logic element 54 can transmit information regarding the relative velocity to the stage 16, the imprint head 30, another suitable component that controls motion of the substrate 12 or the set of the fluid dispense ports 522, and any combination thereof.

The method further includes dispensing fluid droplets of the formable material onto the substrate, at block 744 in FIG. 7. The logic element 54 can transmit information to the fluid dispense system 32 to dispense fluid droplets from the fluid dispense ports 522 to achieve the desired fluid droplet pattern at the proper X-direction fluid droplet pitch and Y-direction fluid droplet pitch. Such fluid droplet pitches are achieved by selecting the proper relative velocity between the substrate 12 and the fluid dispense ports 522 and the proper angular rotation of the fluid dispense ports 522.

The method can include contacting the formable material with the template, at block 762 in FIG. 7. In an embodiment, the imprint surface 22 along the mold 20 of the template 18 has projections 26 and recessions 24, and in another embodiment, the imprint surface 22 can be a blank (a flat surface without any projections or recessions). The contact between the mold 20 of the template 18 and the formable material 34 causes recessions 24 in the mold 20 to fill and also fills in the gaps between fluid droplets.

The method includes curing the formable material to form a patterned layer corresponding to the pattern surface of the template, at block 764 in FIG. 7. Curing can be performed by exposure to electromagnetic radiation. In an embodiment, the electromagnetic radiation can be ultraviolet radiation. In another embodiment, the formable material can be cured using heat. Referring to FIGS. 1 and 2, the patterned layer 46 on the substrate 12 has a complementary pattern as compared to the imprint surface 22 along the mold 20 of the template 18. Projections 50 along the patterned layer 46 correspond to recessions 24 in the imprint surface 22 along the mold 20, and recessions 52 in the patterned layer 46 correspond to projections 26 along the imprint surface 22 of the mold 20. The recessions 46 in the patterned layer 46 are parts of the residual layer 48. The template 18 can be separated from the patterned layer to provide the workpiece as illustrated in FIG. 2, including the patterned layer 46 that overlies the substrate 12.

Figure 9:
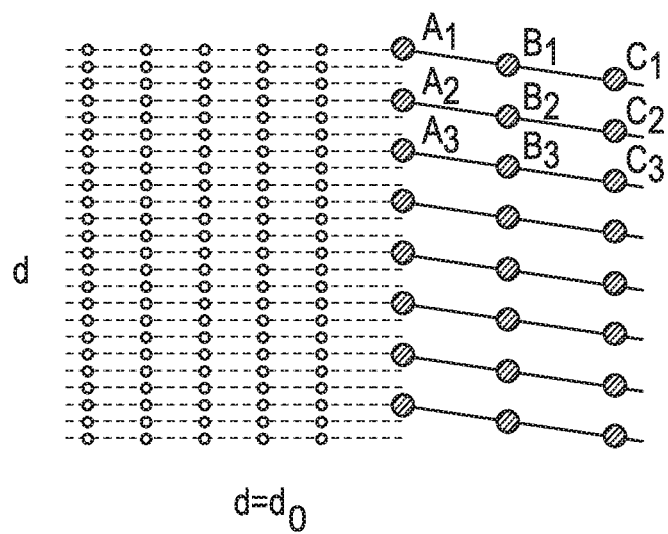
FIG. 9 includes an illustration of fluid droplet dispense pattern for a particular set of fluid dispense ports at a rotation angle of 0°.
Figure 10:
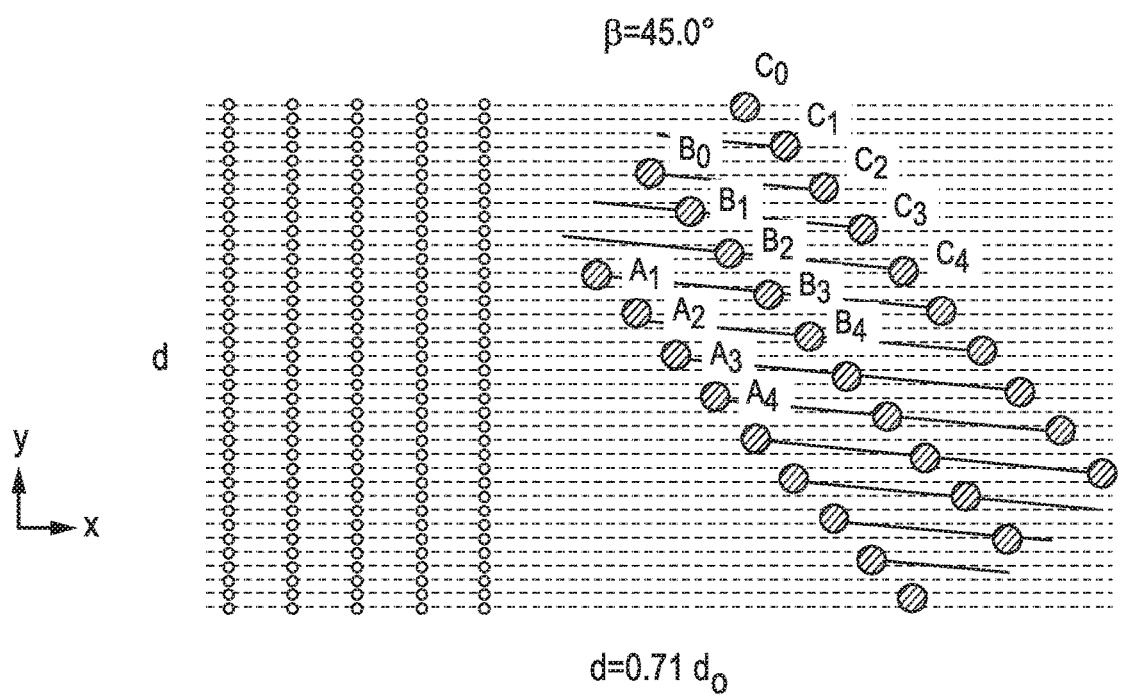
FIG. 10 includes an illustration of fluid droplet dispense pattern for the set of fluid dispense ports in FIG. 9 at a rotation angle of 45.0°.
Figure 11:
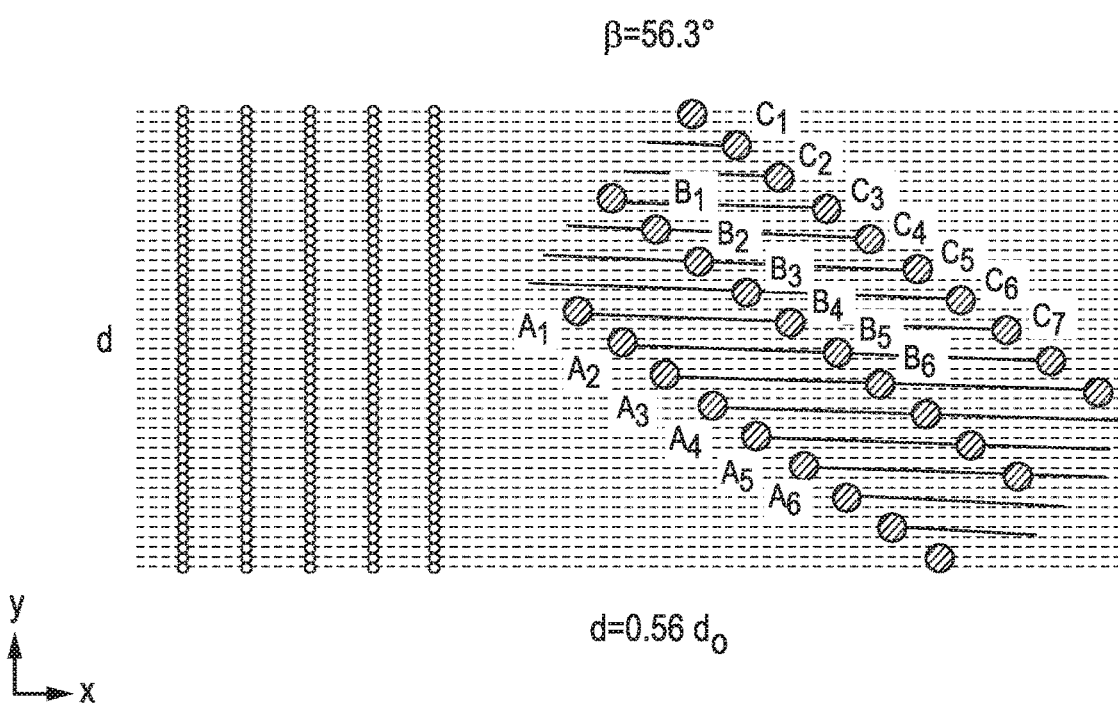
FIG. 11 includes an illustration of fluid droplet dispense pattern for the set of fluid dispense ports in FIG. 11 at a rotation angle of 56.3°.

FIGS. 9 to 11 illustrate how the rotation affects the Y-direction fluid droplet pitch. In FIGS. 9 to 11, the right-hand portions illustrate a set of fluid dispense ports and angular rotation of the set of fluid dispense portions, and the left-hand portions illustrate fluid droplet patterns produced by the set of fluid dispense ports at different angular rotations. In these particular embodiments, the X-direction fluid droplet pitch is substantially the same. In FIG. 9, the columns of fluid dispense ports are aligned in the Y-direction, and therefore, the rotation angle is 0°. Such a configuration has a Y-direction pitch of $d_o$, which is the maximum Y-direction fluid droplet pitch for the particular layout for the set of fluid dispense ports. In FIG. 10, the Y-direction fluid droplet pitch is reduced to 0.7 $d_0$ when the set of fluid dispense ports are rotated 45.0°, and in FIG. 11, the Y-direction fluid droplet pitch is reduced to 0.56 $d_0$ when the set of fluid dispense ports are rotated 56.3°

After reading this specification, skilled artisans will appreciate that the method is not limited to being used with the apparatus 10. Other apparatuses can be used to carry out the method without deviating from the concepts as described herein. Furthermore, other arrangements or organizations of fluid dispense ports can be used while leveraging the concepts as described herein.

Many operations have been described with respect to particular components within the apparatus 10 In particular embodiment, operations performed by the logic element 54 may be performed by other components within the apparatus 10 or split between the logic element 54 and such other components. For example, some operations previously described as being performed by the logic element 54 may be performed by a processor, and other operations performed by a stage controller that controls the operation of the stage 16, the fluid dispense system 32, a fluid dispense head controller that controls fluid dispense head 500, including the gear arrangement 640, or the like. Furthermore, information can be transmitted in order to carry out the actions described herein. The information can be in the form of instructions to be executed, signals, pulses, or the like. The stage 16, the fluid dispense system 32, or both may include a controller that can act on instructions received from the logic element 54. In another embodiment, the stage 16, the fluid dispense system 32 may respond to analog signals received. For example, the information can be a particular direct current voltage or a light pulse. After reading this specification, skilled artisans will be able to configure an imprint lithography apparatus 10 to meet the needs or desires in view of the equipment within the apparatus 10. Thus, the description of the embodiments does not limit the scope of the present invention.

Embodiments described herein allow for relatively smaller Y-direction fluid droplet pitches to be achieved without reconfiguring the arrangement of fluid dispense ports. Thus, an existing apparatus can be used for smaller geometries than what may have been originally intended. Such smaller geometries can be achieved by as little as rotating the fluid dispense ports. Simulations can be performed to determine a set of allowable discrete angles of rotation that can achieve a substantially uniform fluid droplet pitch. Any of several implementations may be used, and thus, the particular implementation can be tailored to a particular equipment configuration of an imprint lithography apparatus. A costly redesign of a fixture that holds the fluid dispense ports or fluid channels within the fixture can be avoided. In particular, the fluid dispense system does not need to have the fluid dispense ports where fluid channels within the fluid dispense head need to be reconfigured or orienting the fluid dispense ports along a plane that is not substantially parallel to the major surface of the substrate. Furthermore, the number of rows and columns as described herein may allow for an imprint field to be formed in as little as a single pass or in fewer passes than when fluid dispense ports are oriented along a single row or a single column.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of generating a fluid droplet pattern for an imprint lithography process, the method comprising:
   rotating a set of the fluid dispense ports arranged on a fluid dispense head in a fixed arrangement of at least two rows and at least two columns to a rotation angle to change a fluid droplet pitch in a first direction while the fluid dispense ports remain in the fixed arrangement, wherein the rotation angle is selected from a set of discrete rotation angles, and wherein the number of discrete rotational angles in the set of discrete rotational angles decreases as the number of columns increases;
   moving a substrate and the set of the fluid dispense ports relative to each other in a second direction substantially perpendicular to the first direction; and
   dispensing fluid droplets of a formable material onto the substrate while moving the substrate and the set of the fluid dispense ports relative to each other, wherein the fluid droplets of the fluid droplet pattern have the fluid droplet pitch in the first direction.

2. The method of claim 1, wherein rotating set of the fluid dispense ports comprises rotating a fixture that holds the set of the fluid dispense ports in the fixed arrangement.

3. The method of claim 1, further comprising determining the rotation angle to achieve the fluid droplet pitch in the first direction.

4. The method of claim 1, wherein the set of discrete rotation angles includes at least three different rotation angles.

5. The method of claim 1, wherein during dispensing, the set of the fluid dispense ports are oriented along a plane that is substantially planar to a major surface of the substrate.

6. The method of claim 1, wherein rotating is along a plane substantially parallel to a major surface of the substrate.

7. The method of claim 1, further comprising determining a firing order and timing for firing of the fluid dispense ports within the set of fluid dispense ports.

8. A method of manufacturing an article, the method comprising:

rotating a set of the fluid dispense ports arranged on a fluid dispense head in a fixed arrangement of at least two rows and at least two columns to a rotation angle to change a fluid droplet pitch in a first direction while the fluid dispense ports remain in the fixed arrangement, wherein the rotation angle is selected from a set of discrete rotation angles, and wherein the number of discrete rotational angles in the set of discrete rotational angles decreases as the number of columns increases;

moving a substrate and the set of the fluid dispense ports relative to each other in a second direction substantially perpendicular to the first direction;

dispensing fluid droplets of a formable material onto the substrate while moving the substrate and the set of the fluid dispense ports relative to each other, wherein the fluid droplets of the fluid droplet pattern have the fluid droplet pitch in the first direction;

contacting the formable material with a template having a surface; and curing the formable material to form a layer corresponding to the surface of the template.

9. The method of claim 8, wherein the article includes an electronic device, and the substrate includes a semiconductor wafer.

10. The method of claim 8, further comprising determining the rotation angle to achieve the fluid droplet pitch in the first direction.

11. The method of claim 10, wherein determining the rotation angle is performed by a logic element.

12. The method of claim 10, wherein determining the rotation angle comprises selecting a particular rotation angle from a set of discrete rotation angles including at least three different rotation angles.

13. The method of claim 8, wherein rotating the fluid dispense head is performed in accordance with information provided by a logic element.

14. The method of claim 8, wherein the rows and columns lie along lines, and wherein the lines corresponding to the rows intersect the lines corresponding to the columns at angles other than right angles.

15. The method of claim 1, wherein adjacent rows of fluid dispense ports are oriented to create a staggered arrangement.

16. The method of claim 1, wherein rotating the fluid dispense head is performed in accordance with information provided by a logic element.

17. The method of claim 1, wherein the rows and columns lie along lines, and wherein the lines corresponding to the rows intersect the lines corresponding to the columns at angles other than right angles.

18. The method of claim 1, further comprising determining a firing order for the fluid dispense ports, wherein dispensing fluid droplets of the formable material onto the substrate is performed at the determined firing order.

* * * * *